United States Patent [19]
Komatsu

[11] Patent Number: 6,084,793
[45] Date of Patent: Jul. 4, 2000

[54] SINGLE-CHIP READ-ONLY MEMORY (ROM) SYSTEM

[75] Inventor: Noriaki Komatsu, Tokyo, Japan

[73] Assignee: NEC Corporation, Tokyo, Japan

[21] Appl. No.: 08/984,092

[22] Filed: Dec. 3, 1997

[30] Foreign Application Priority Data

Dec. 16, 1996 [JP] Japan .................................. 8-335845

[51] Int. Cl.[7] .................................................. G11C 17/00
[52] U.S. Cl. ........................... 365/94; 365/94; 365/104; 365/203; 365/185.17; 365/185.25
[58] Field of Search .............................. 365/94, 104, 203, 365/185.17, 185.25

[56] References Cited

U.S. PATENT DOCUMENTS

| | | | |
|---|---|---|---|
| 5,268,861 | 12/1993 | Hotta | 365/104 |
| 5,394,371 | 2/1995 | Hotta | 365/94 |
| 5,650,959 | 7/1997 | Hayashi et al. | 365/203 |
| 5,757,709 | 5/1998 | Suminaga et al. | 365/203 |
| 5,793,666 | 8/1998 | Yamazaki | 365/104 |
| 5,825,683 | 10/1998 | Chang | 365/104 |
| 5,886,937 | 3/1999 | Jang | 365/203 |

FOREIGN PATENT DOCUMENTS 6-20488  1/1994  Japan .

OTHER PUBLICATIONS

Japanese Office Action dated Jun. 23, 1999, with partial translation.

*Primary Examiner*—Trong Phan
*Attorney, Agent, or Firm*—McGinn & Gibb, P.C.

[57] ABSTRACT

A compact read-only memory (ROM) system with low current consumption and having a plurality of data lines and a word line, includes a first ROM cell having a gate connected to the word line and a source-drain path connected between a first data line and a second data line, a second ROM cell having a gate connected to the word line and a source-drain path connected between the second data line and a third data line, a third ROM cell having a gate connected to the word line and a source-drain path connected between the third data line and a fourth data line, and a sense amplifier for amplifying data from one of the ROM cells. The first data line is connected to a voltage source and the second data line is connected to the sense amplifier when data from the first ROM cell is read, and the third and fourth data lines are charged to a predetermined voltage.

15 Claims, 9 Drawing Sheets

| SELECT CELL | SA DATA-LINE | SELECT GND-LINE | CHARGE DATA-LINE | Y10 | Y00 | Y01 | Y02 | PC0 | PC1 | PC2 | VG0 | VG1 | VG2 | VG3 |
| --- | --- | --- | --- | --- | --- | --- | --- | --- | --- | --- | --- | --- | --- | --- |
| MC1 | D1 | D0 | D2, D3, D4 | 1 | 1 | 0 | 0 | 0 | 1 | 0 | 1 | 0 | 0 | 0 |
| MC3 | D3 | D2 | D4, D5, D6 | 1 | 0 | 1 | 0 | 0 | 0 | 1 | 0 | 1 | 0 | 0 |
| MC4 | D3 | D4 | D0, D1, D2 | 1 | 0 | 1 | 1 | 1 | 0 | 0 | 0 | 0 | 1 | 0 |
| MC6 | D5 | D6 | D2, D3, D4 | 1 | 0 | 0 | 1 | 0 | 1 | 0 | 0 | 0 | 0 | 1 |

FIG. 4

| SELECT CELL | SA DATA-LINE | SELECT GND-LINE | CHARGE DATA-LINE | Y10 | Y00 | Y01 | Y02 | PC0 | PC1 | PC2 | PC3 | F | B | VG0 | VG1 | VG2 | VG3 |
|---|---|---|---|---|---|---|---|---|---|---|---|---|---|---|---|---|---|
| MC1 | D1 | D0 | D2, D3 | 1 | 1 | 0 | 0 | 0 | 1 | 0 | 0 | 0 | 1 | 1 | 0 | 0 | 0 |
| MC3 | D3 | D2 | D4, D5 | 1 | 0 | 1 | 0 | 0 | 0 | 1 | 0 | 0 | 1 | 0 | 1 | 0 | 0 |
| MC4 | D3 | D4 | D1, D2 | 1 | 0 | 1 | 1 | 0 | 1 | 0 | 0 | 1 | 0 | 0 | 0 | 1 | 0 |
| MC6 | D5 | D6 | D3, D4 | 1 | 0 | 0 | 1 | 0 | 0 | 1 | 0 | 1 | 0 | 0 | 0 | 0 | 1 |

FIG.8

SINGLE-CHIP READ-ONLY MEMORY (ROM) SYSTEM

BACKGROUND OF THE INVENTION

The present invention generally relates to a single-chip read-only memory (ROM) system, and more particularly to a ROM system for having low current consumption.

DESCRIPTION OF THE RELATED ART

With recent advancements in fabricating a single-chip semiconductor read-only memory (ROM) system, many types of ROMs are used. For example, as a non-volatile memory, a mask ROM (MROM), a fused ROM, an erasable and programmable ROM (EP-ROM), and an electrically erasable and programmable ROM (EEP-ROM) have been developed.

Particularly, the MROM is suitable for fabricating a highly integrated ROM system. Therefore, the MROM is included frequently in the system. As the MROM, a vertical-type MROM (e.g., an AND-type MROM, a NAND-type MROM) and a lateral-type MROM (e.g., an OR-type MROM, a NOR-type MROM) can be used. However, the vertical-type MROM typically needs a voltage source having a higher voltage than that of the lateral MROM. Therefore, the lateral MROM is used more frequently.

However, a conventional lateral MROM still consumes much current, because all bit lines (e.g., data lines), except for a pair of bit lines connected to a selected MROM cell, are charged for preventing the system from reading incorrect data, when the data of the selected MROM cell is read.

For solving the problem of the conventional system, Japanese Patent Application Laid-Open No. Hei 6-20488 discloses an improved lateral ROM system. In the system, some bit lines, but not all bit lines, are charged when data of a selected MROM cell is read. Therefore, in the system, current consumption becomes smaller.

However, although Japanese Patent Application Laid-Open No. Hei 6-20488 discloses a circuit for selecting only one bit line to be charged, there is no description of a circuit for selecting bit lines to be charged. Additionally, there is no disclosure of the connections and control characteristics of the system. Furthermore, in practice, the system cannot read a correct data from the ROM cell. Therefore, a system having low current consumption has not been fabricated or known.

As mentioned above, the conventional lateral ROM systems cannot achieve simultaneously low current consumption and high integration in a smaller semiconductor chip. This is a problem.

SUMMARY OF THE INVENTION

In view of the foregoing and other problems of the conventional lateral ROM system, it is therefore an object of the present invention to provide an improved single-chip semiconductor ROM system.

It is another object of the present invention to provide a circuit for selecting some of a plurality of bit lines, which are charged when data of a selected ROM cell in the ROM system, is read.

In a first aspect, a ROM system having a plurality of data lines, a word line, and a voltage source, according to the present invention, includes a first ROM cell having a gate connected to the word line and a source-drain path connected between a first data line and a second data line, a second ROM cell having a gate connected to the word line and a source-drain path connected between the second data line and a third data line, a third ROM cell having a gate connected to the word line and a source-drain path connected between the third data line and a fourth data line, and a sense amplifier for amplifying data from one of the first, second and third ROM cells. The first data line is connected to the voltage source and the second data line is connected to the sense amplifier when data from the first ROM cell is read, and the third and fourth data lines are charged to a predetermined voltage.

With the unique and unobvious structure of the present invention, at least two data lines are charged when data of a selected MROM cell is read. Additionally, the two data lines, which are charged, are adjacent to the data line connected to the sense amplifier. Moreover, the two data lines are on opposite sides of the data line connected to a first voltage source. As a result, the ROM system according to the present invention has high integration and simultaneously is operated effectively with low current consumption.

BRIEF DESCRIPTION OF THE DRAWINGS

The foregoing and other objects, aspects and advantages will be better understood from the following detailed description of preferred embodiments of the invention with reference to the drawings, in which:

FIG. 4 is a table for explaining a relationship between a selected MROM cell and data lines which are charged, according to the first embodiment of the present invention;

FIG. 8 is a table for explaining a relationship between a selected MROM cell and data lines which are charged, according to the third embodiment of the present invention.

DETAILED DESCRIPTION OF PREFERRED EMBODIMENTS OF THE INVENTION

Figure 1:
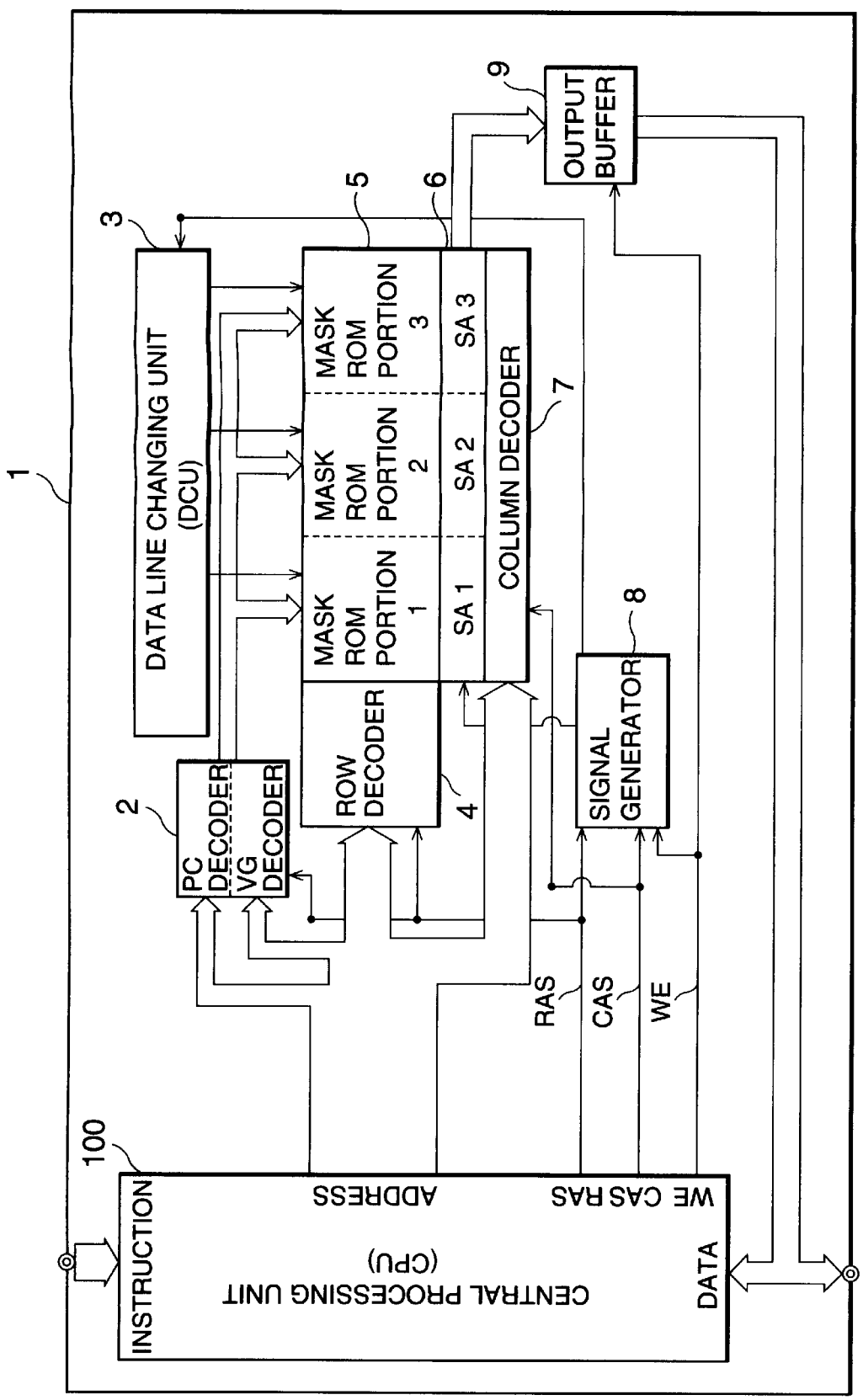
FIG. 1 is a diagram of a single-chip semiconductor mask read-only memory (MROM) system according to a first embodiment of the present invention.

Referring now to the drawings, and more particularly to FIGS. 1–4, a single-chip semiconductor read-only memory (ROM) system 1 is described according to a first embodiment of the present invention.

In the first embodiment, the ROM system 1 includes a control decoder 2 having a PC decoder and a VG decoder, a data line charging unit (DCU) 3, a row decoder 4, a mask ROM array 5 having three mask ROM (MROM) portions, a sense amplifier 6 having three sense amplifier portions SA1, SA2, and SA3, respectively, corresponding to the three MROM portions, a column decoder 7, a signal generator 8, an output buffer 9, and an internal central processing unit (CPU) 100. Each MROM portion includes a plurality of MROM cells, word lines, and data lines.

The CPU 100 executes an instruction by using data from the mask ROM array 5, outputs a row address strobe (RAS) signal, a column address strobe (CAS) signal, a write enable signal WE, and an address signal.

When the CPU 100 changes the RAS signal to an active level (e.g., "1") from an inactive level (e.g., "0"), the row decoder 4 and the control decoder 2 decode the address signal. At this time, the row decoder 4 activates (selects) a word line among the word lines, corresponding to the address signal. The control decoder 2 selects a data line for connecting to a ground voltage (e.g., "0"), and a few (e.g., 3 in a preferred embodiment) data lines for connecting to the DCU 3.

When the RAS signal, the CAS signal, and the WE signal have a first predetermined timing, the signal generator 8 controls the DCU 3 to charge the selected data lines.

When the CPU 100 changes the CAS signal to an active level (e.g., "1") from an inactive level (e.g., "0"), the column decoder 7 decodes the address signal, and selects the data line corresponding to the address signal, for connecting to the sense amplifier 6.

When the RAS signal, the CAS signal, and the WE signal have a second predetermined timing, the signal generator 8 controls the sense amplifier 6 to amplify data from the selected data line.

The output buffer 9 transmits the amplified data from the sense amplifier 6 to the CPU 100, when the WE signal has an active level (e.g., "1"), and does not transmit the data from the sense amplifier 6 to the CPU 100, when the WE signal has an inactive level (e.g., "0").

Figure 2:
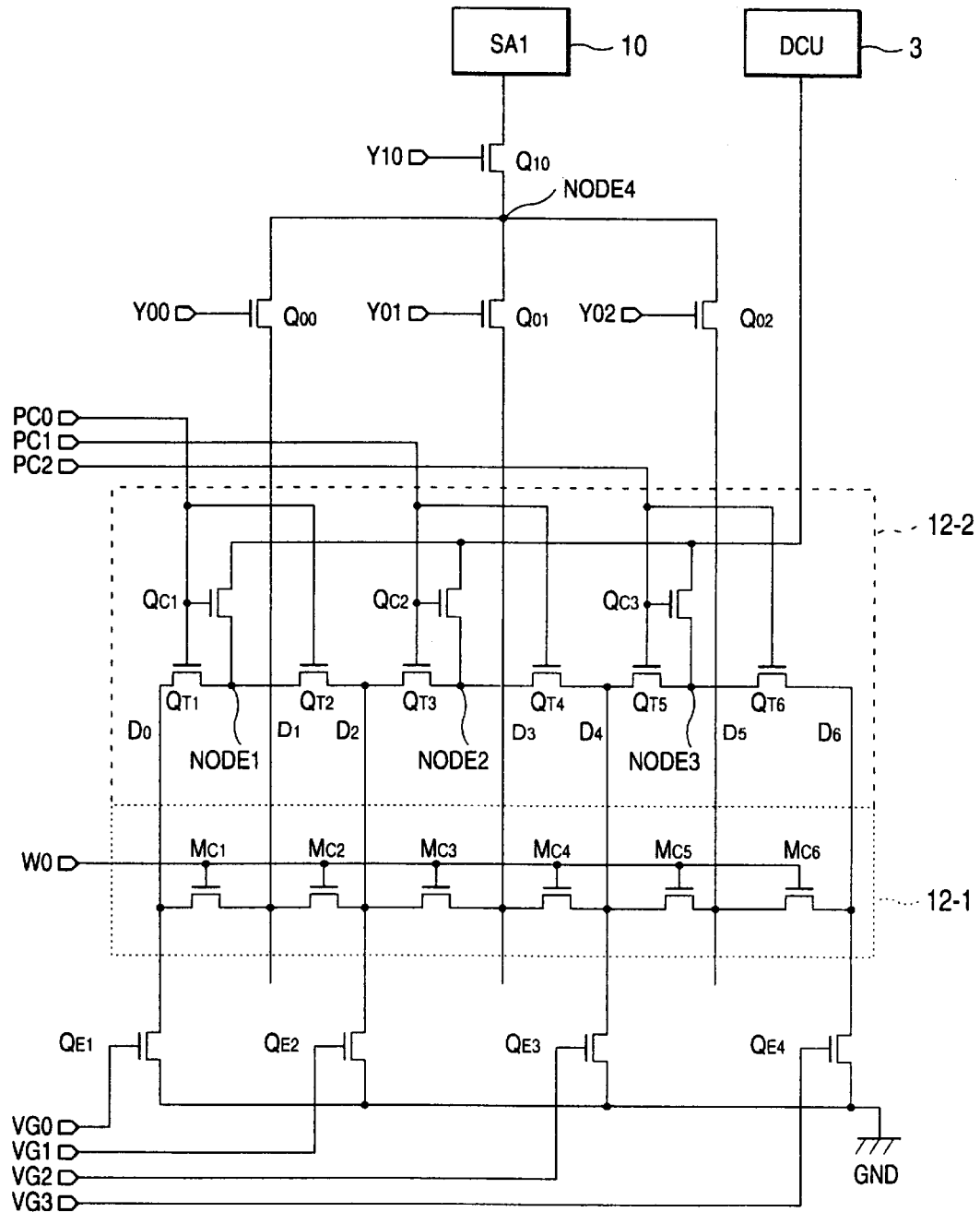
FIG. 2 is a circuit diagram of a selector and MROM cells in FIG. 1.

FIG. 2 illustrates a circuit diagram of a selector 12-2 and MROM cells 12-1 in the MROM portion 1 in FIG. 1. The MROM portion 1 has substantially the same structure as the MROM portions 2 and 3. In practice, there are many word lines W0–Wi (e.g., i is an integer and i>1) and MROM cells. However, in this explanation, only one word line W0 and six MROM cells $M_{C1}$–$M_{C6}$ are described for easy understanding.

The row decoder 4 controls the word line W0, and the column decoder 7 controls signals Y00, Y01, Y02 and Y10. Moreover, the PC decoder in the control decoder 2 controls signals PC0, PC1 and PC2, and the VG decoder in the control decoder 2 controls signals VG0, VG1, VG2 and VG3.

The word line W0 is connected to gates of the MROM cells $M_{C1}$–$M_{C6}$. A source-drain path of the MROM cell $M_{C1}$ is connected between data lines $D_0$ and $D_1$, a source-drain path of the MROM cell $M_{C2}$ is connected between data lines $D_1$ and $D_2$, a source-drain path of the MROM cell $M_{C3}$ is connected between data lines $D_2$ and $D_3$, a source-drain path of the MROM cell $M_{C4}$ is connected between data lines $D_3$ and $D_4$, a source-drain path of the MROM cell $M_{C5}$ is connected between data lines $D_4$ and $D_5$, and a source-drain path of the MROM cell $M_{C6}$ is connected between data lines $D_5$ and $D_6$.

A metal oxide semiconductor (MOS) transistor $Q_{E1}$ has a gate for receiving the signal VG0, and a source-drain path connected between the data line $D_0$ and a first voltage source (e.g., ground voltage (GND)). A MOS transistor $Q_{E2}$ has a gate for receiving the signal VG1, and a source-drain path connected between the data line $D_2$ and the first voltage source. A MOS transistor $Q_{E3}$ has a gate for receiving the signal VG2, and a source-drain path connected between the data line $D_4$ and the first voltage source. A MOS transistor $Q_{E4}$ has a gate for receiving the signal VG3, and a source-drain path connected between the data line $D_6$ and the first voltage source.

The selector 12-2 has MOS transistors $Q_{T1}$–$Q_{T6}$ and $Q_{C1}$–$Q_{C3}$. The MOS transistor $Q_{T1}$ has a gate for receiving the signal PC0 and a source-drain path connected between the data line $D_0$ and a node 1, the MOS transistor $Q_{T2}$ has a gate for receiving the signal PC0 and a source-drain path connected between the data line $D_2$ and the node 1, and the MOS transistor $Q_{C1}$ has a gate for receiving the signal PC0 and a source-drain path connected between the node 1 and the DCU 3.

The MOS transistor $Q_{T3}$ has a gate for receiving the signal PC1 and a source-drain path connected between the data line $D_2$ and a node 2, the MOS transistor $Q_{T4}$ has a gate for receiving the signal PC1 and a source-drain path connected between the data line $D_4$ and the node 2, and the MOS transistor $Q_{C2}$ has a gate for receiving the signal PC1 and a source-drain path connected between the node 2 and the DCU 3.

The MOS transistor $Q_{T5}$ has a gate for receiving the signal PC2 and a source-drain path connected between the data line $D_4$ and a node 3, the MOS transistor $Q_{T6}$ has a gate for receiving the signal PC2 and a source-drain path connected between the data line $D_6$ and the node 3, and the MOS transistor $Q_{C3}$ has a gate for receiving the signal PC2 and a source-drain path connected between the node 3 and the DCU 3.

A MOS transistor $Q_{00}$ has a gate for receiving the signal Y00 and a source-drain path connected between the data line $D_1$ and a node 4, a MOS transistor $Q_{01}$ has a gate for receiving the signal Y01 and a source-drain path connected between the data line $D_3$ and the node 4, and a MOS transistor $Q_{02}$ has a gate for receiving the signal Y02 and a source-drain path connected between the data line $D_5$ and the node 4.

A MOS transistor $Q_{10}$ has a gate for receiving the signal Y10 and a source-drain path connected between the node 4 and the sense amplifier portion SA1 10.

Figure 3:
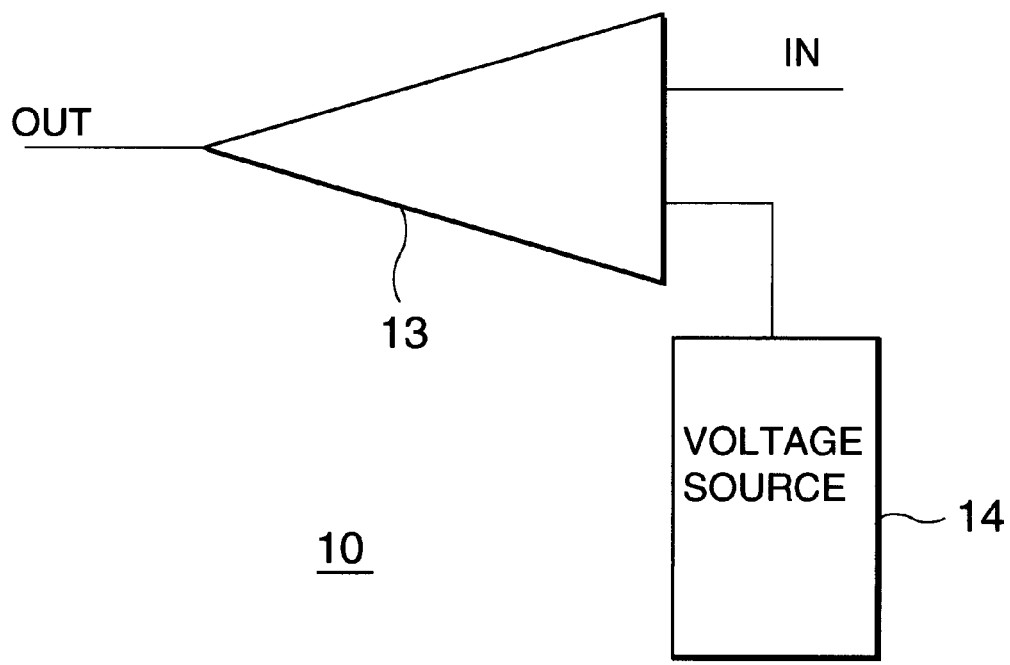
FIG. 3 is a diagram of a preferred structure of a sense amplifier according to the present invention.

FIG. 3 illustrates a diagram of the sense amplifier portion SA1 10. The sense amplifier portion SA1 includes a differential amplifier 13 and a voltage source 14 supplying a predetermined voltage. The voltage source 14 is connected to a first input of the differential amplifier 13, and the source-drain path of the MOS transistor $Q_{10}$ (shown in FIG. 2) is connected to a second input IN of the differential amplifier 13.

When a voltage of the second input IN is lower than the predetermined voltage supplied from the voltage source 14, the differential amplifier 13 outputs the first voltage (e.g., GND voltage). When a voltage of the second input IN is higher than the predetermined voltage of the voltage source 14, the differential amplifier 13 outputs a second voltage (e.g., $V_{CC}$) which is higher than the predetermined voltage.

FIG. 4 is a table for explaining a reading operation for reading data from a MROM cell. For example, when the MROM cell $M_{C1}$ is selected, each signal is operated as follows.

The PC decoder in the control decoder 2 changes the signals PC0 and PC2 to an inactive level (e.g., "0") and the signal PC1 to an active level (e.g., "1"). Therefore, the MOS transistors $Q_{T3}$, $Q_{T4}$ and $Q_{C2}$ are activated and turned "ON".

As a result, the data lines $D_2$ and $D_4$ are electrically connected to the DCU 3 for being charged. In this case, when either the MROM cell $M_{C3}$ or $M_{C4}$ is not masked, the data line $D_3$ is also electrically connected to the DCU 3.

The VG decoder in the control decoder 2 changes the signals VG1, VG2 and VG3 to an inactive level (e.g., "0") and the signal VG0 to an active level (e.g., "1"). Therefore, the MOS transistor $Q_{F1}$ is activated and turned "ON". As a result, the data line $D_0$ is electrically connected to the first voltage source (e.g., GND).

After the DCU charges the data lines $D_2$–$D_4$, the column decoder 7 changes the signals Y01 and Y02 to an inactive level (e.g., "0") and the signal Y00 to an active level (e.g., "1"). Moreover, the column decoder 7 changes the signal Y10 to an active level (e.g., "1"). As a result, the data line $D_1$ is electrically connected to the sense amplifier SA1 10.

Therefore, the sense amplifier SA1 10 can amplify the data of the MROM cell $M_{C1}$. When the MROM cell $M_{C1}$ is not masked, the voltage of the data line $D_1$ falls below the predetermined voltage. As a result, the sense amplifier SA1 10 outputs the first voltage (e.g., GND voltage). When the MROM cell $M_{C1}$ is masked, the voltage of the data line $D_1$ becomes more than the predetermined voltage. As a result, the sense amplifier SA1 10 outputs the second voltage (e.g., $V_{CC}$).

Reading operations for reading data from the other MROM cells are apparent from the table in FIG. 4. Therefore, for brevity, explanations of these other reading operations are omitted.

As mentioned above, in the ROM system according to the first embodiment, some (e.g., three) data lines, but not all data lines, are charged when data of a selected MROM cell is read. Further, the selector 12-2 has a very simple circuit design for charging the data lines. Therefore, in the system, low current consumption and high integration in a smaller semiconductor chip are simultaneously obtained.

Second Embodiment

Figure 5:
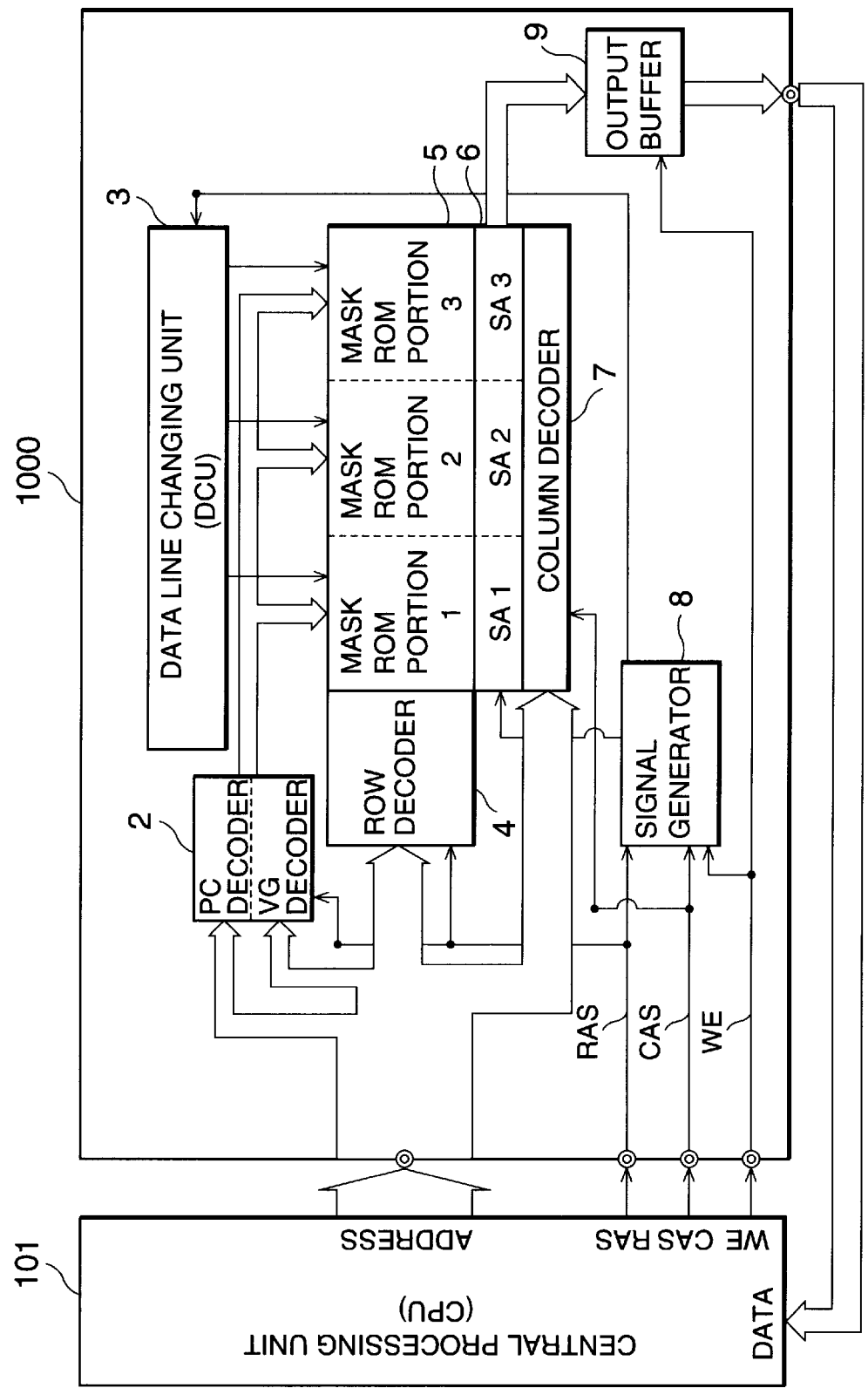
FIG. 5 is a diagram of a single-chip semiconductor MROM system and an external central processing unit (CPU) according to a second embodiment of the present invention.

Referring now to the drawings, and more particularly to FIG. 5, a single-chip semiconductor ROM system 1000 and an external central processing unit (CPU) 101 are described according to a second embodiment of the present invention. The same parts in FIG. 5 as those in FIGS. 1–4 are numbered with the same reference numerals as in FIGS. 1–4, and for brevity, an explanation of these parts is omitted.

In the second embodiment, the external CPU 101 is located outside of the single-chip semiconductor ROM system 1000. Therefore, the chip size becomes much smaller than the system in FIG. 1. The operation of the second embodiment is substantially the same as the first embodiment. Hence, for brevity, an explanation is omitted herein.

Third Embodiment

Figure 6:
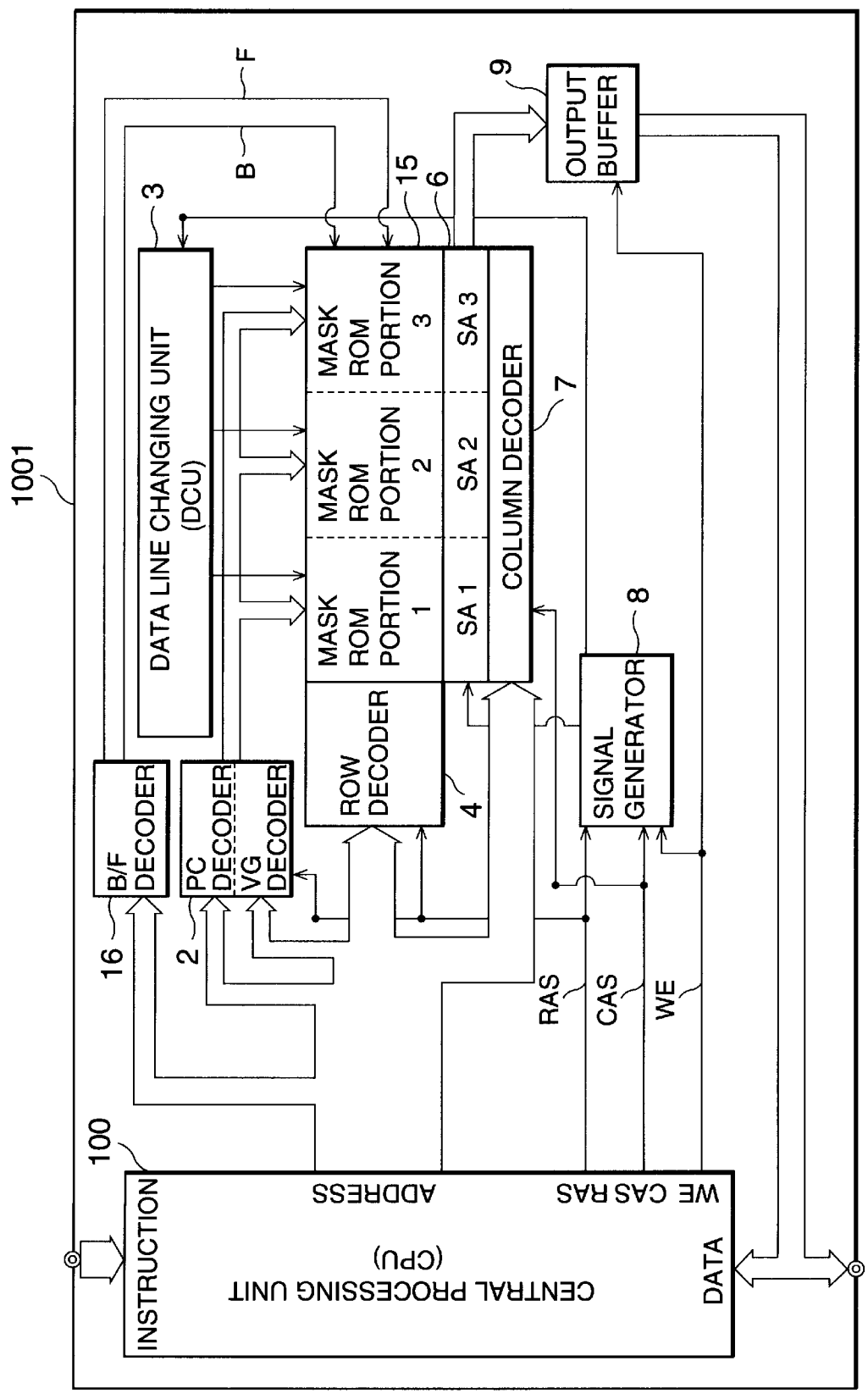
FIG. 6 is a diagram of a single-chip semiconductor MROM system according to a third embodiment of the present invention.
Figure 7:
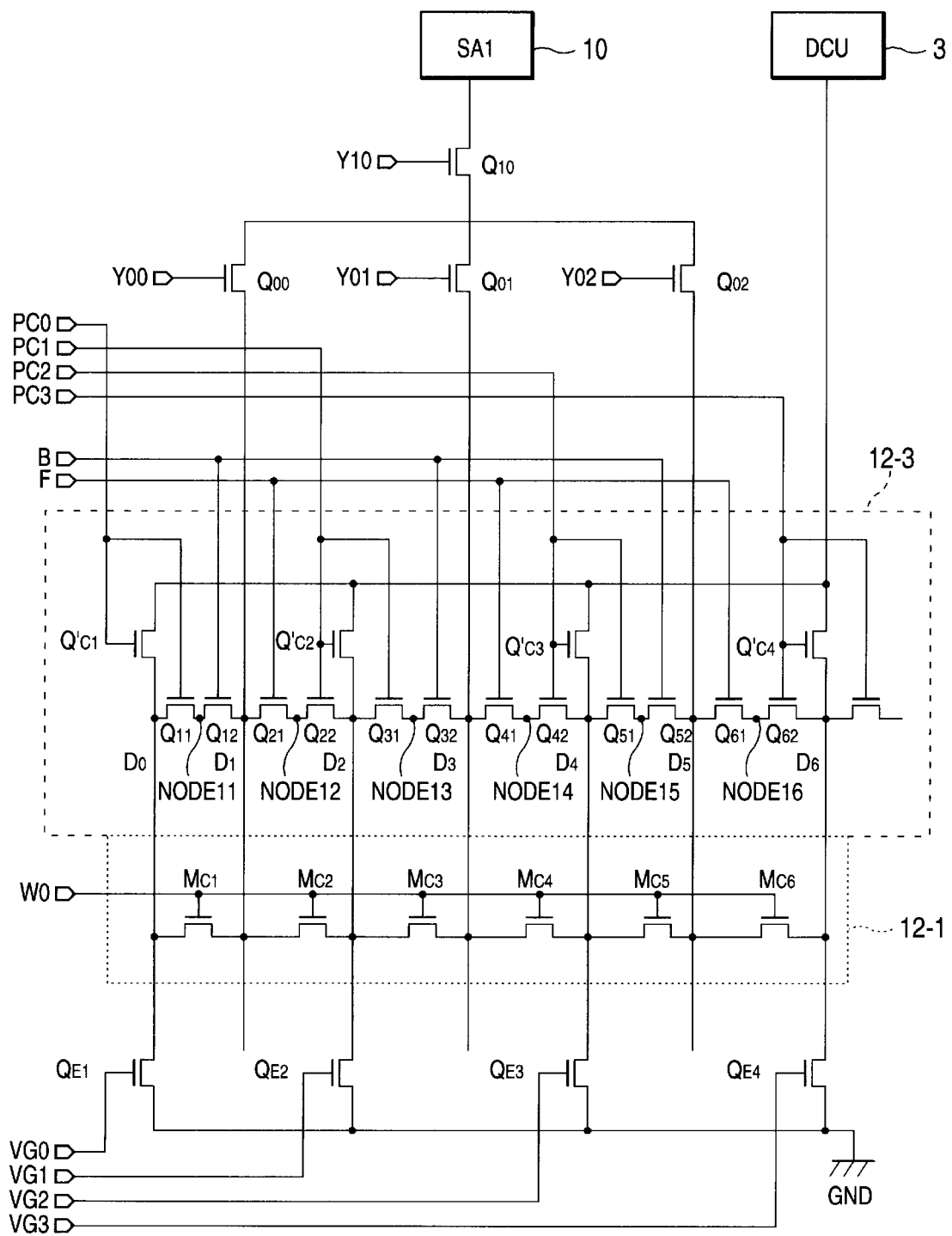
FIG. 7 is a circuit diagram of a selector and MROM cells in FIG. 6.

Referring now to the drawings, and more particularly to FIGS. 6–8, a single-chip semiconductor ROM system 1001 is described according to a third embodiment of the present invention. The same parts in FIGS. 6–8 as those in FIGS. 1–4 are numbered with the same reference numerals as in FIGS. 1–4. For brevity, an explanation of these parts is omitted.

The system in FIG. 6 has a B/F decoder 16 in addition to the parts in FIG. 1. The B/F decoder 16 decodes the address signal, and outputs complementary signals B and F in response to the address signal. When the signal F has an active level (e.g., "1"), the signal B has an inactive level (e.g., "0"). Conversely, when the signal F has an inactive level (e.g., "0"), the signal B has an active level (e.g., "1").

FIG. 7 illustrates a circuit diagram of a selector 12-3 and MROM cells 12-1 in the MROM portion 1 in FIG. 6. The MROM portion 1 has substantially the same structure as the MROM portions 2 and 3. In practice, there are many word lines W0–Wi (e.g., i is an integer and i>1) and MROM cells. However, in this explanation, only one word line W0 and six MROM cells $M_{C1}$–$M_{C6}$ are described for easy understanding.

The row decoder 4 controls the word line W0, and the column decoder 7 controls signals Y00, Y01, Y02 and Y10. Moreover, the PC decoder in the control decoder 2 controls signals PC0, PC1, PC2 and PC3, and the VG decoder in the control decoder 2 controls signals VG0, VG1, VG2 and VG3.

The selector 12-3 has MOS transistors $Q_{11}$, $Q_{12}$, $Q_{21}$, $Q_{22}$, $Q_{31}$, $Q_{32}$, $Q_{41}$, $Q_{42}$, $Q_{51}$, $Q_{52}$, $Q_{61}$, $Q_{62}$ and $Q'_{C1}$–$Q'_{C4}$. The MOS transistor $Q_{11}$ has a gate for receiving the signal PC0 and a source-drain path connected between the data line $D_0$ and a node 11, the MOS transistor $Q_{12}$ has a gate for receiving the signal B and a source-drain path connected between the data line $D_1$ and the node 11, and the MOS transistor $Q'_{C1}$ has a gate for receiving the signal PC0 and a source-drain path connected between the data line $D_0$ and the DCU 3.

The MOS transistor $Q_{21}$ has a gate for receiving the signal F and a source-drain path connected between the data line $D_1$ and a node 12, and the MOS transistor $Q_{22}$ has a gate for receiving the signal PC1 and a source-drain path connected between the data line $D_2$ and the node 12, and the MOS transistor $Q'_{C2}$ has a gate for receiving the signal PC1 and a source-drain path connected between the data line $D_2$ and the DCU 3.

The MOS transistor $Q_{31}$ has a gate for receiving the signal PC1 and a source-drain path connected between the data line $D_2$ and a node 13, and the MOS transistor $Q_{32}$ has a gate for receiving the signal B and a source-drain path connected between the data line $D_3$ and the node 13.

The MOS transistor $Q_{41}$ has a gate for receiving the signal F and a source-drain path connected between the data line $D_3$ and a node 14, the MOS transistor $Q_{42}$ has a gate for receiving the signal PC2 and a source-drain path connected between the data line $D_4$ and the node 14, and the MOS transistor $Q'_{C3}$ has a gate for receiving the signal PC2 and a source-drain path connected between the data line $D_4$ and the DCU 3.

The MOS transistor $Q_{51}$ has a gate for receiving the signal PC2 and a source-drain path connected between the data line $D_4$ and a node 15, and the MOS transistor $Q_{52}$ has a gate for receiving the signal B and a source-drain path connected between the data line $D_5$ and the node 15.

The MOS transistor $Q_{61}$ has a gate for receiving the signal F and a source-drain path connected between the data line $D_5$ and a node 16, the MOS transistor $Q_{62}$ has a gate for receiving the signal PC3 and a source-drain path connected between the data line $D_6$ and the node 16, and the MOS transistor $Q'_{C4}$ has a gate for receiving the signal PC3 and a source-drain path connected between the data line $D_6$ and the DCU 3.

FIG. 8 is a table for explaining a reading operation for reading data from a MROM cell. For example, when the MROM cell $M_{C1}$ is selected, each signal is operated as follows.

The PC decoder in the control decoder 2 changes the signals PC0, PC2 and PC3 to an inactive level (e.g., "0") and the signal PC1 to an active level (e.g., "1"). Therefore, the MOS transistors $Q_{22}$, $Q_{31}$ and $Q'_{C2}$ are activated and turned "ON". Moreover, the B/F decoder 16 changes the signal B to an active level (e.g., "1") and the signal F to an inactive level (e.g., "0"). As a result, the data lines $D_2$ and $D_3$ are electrically connected to the DCU 3 for being charged.

The VG decoder in the control decoder 2 changes the signals VG1, VG2 and VG3 to an inactive level (e.g., "0") and the signal VG0 to an active level (e.g., "1"). Therefore, the MOS transistor $Q_{E1}$ is activated and turned "ON". As a result, the data line $D_0$ is electrically connected to the first voltage source (e.g., GND).

After the DCU 3 charges the data lines $D_2$ and $D_3$, the column decoder 7 changes the signals Y01 and Y02 to an inactive level (e.g., "0") and the signal Y00 to an active level (e.g., "1"). Moreover, the column decoder 7 changes the signal Y10 to an active level (e.g., "1"). As a result, the data line $D_1$ is electrically connected to the sense amplifier SA1 10.

Therefore, the sense amplifier SA1 10 can amplify the data of the MROM cell $M_{C1}$. When the MROM cell $M_{C1}$ is not masked, the voltage of the data line $D_1$ falls below the predetermined voltage. As a result, the sense amplifier SA1 10 outputs the first voltage (e.g., GND voltage). When the MROM cell $M_{C1}$ is masked, the voltage of the data line $D_1$ rises above the predetermined voltage. As a result, the sense amplifier SA1 10 outputs the second voltage (e.g., $V_{CC}$).

Reading operations for reading data from the other MROM cells are apparent from the table in FIG. 8. Therefore, for brevity, explanations of these are omitted.

As mentioned above, in the ROM system according to the third embodiment, some (e.g., two) data lines, but not all data lines, are charged when data of a selected MROM cell is read. Further, the selector 12-3 still has a simple circuit for charging the data lines, although it is a more complicated circuit than the selector 12-2 in FIG. 2. Therefore, in the system, low current consumption and high integration in a smaller semiconductor chip are simultaneously obtained.

Fourth Embodiment

Figure 9:
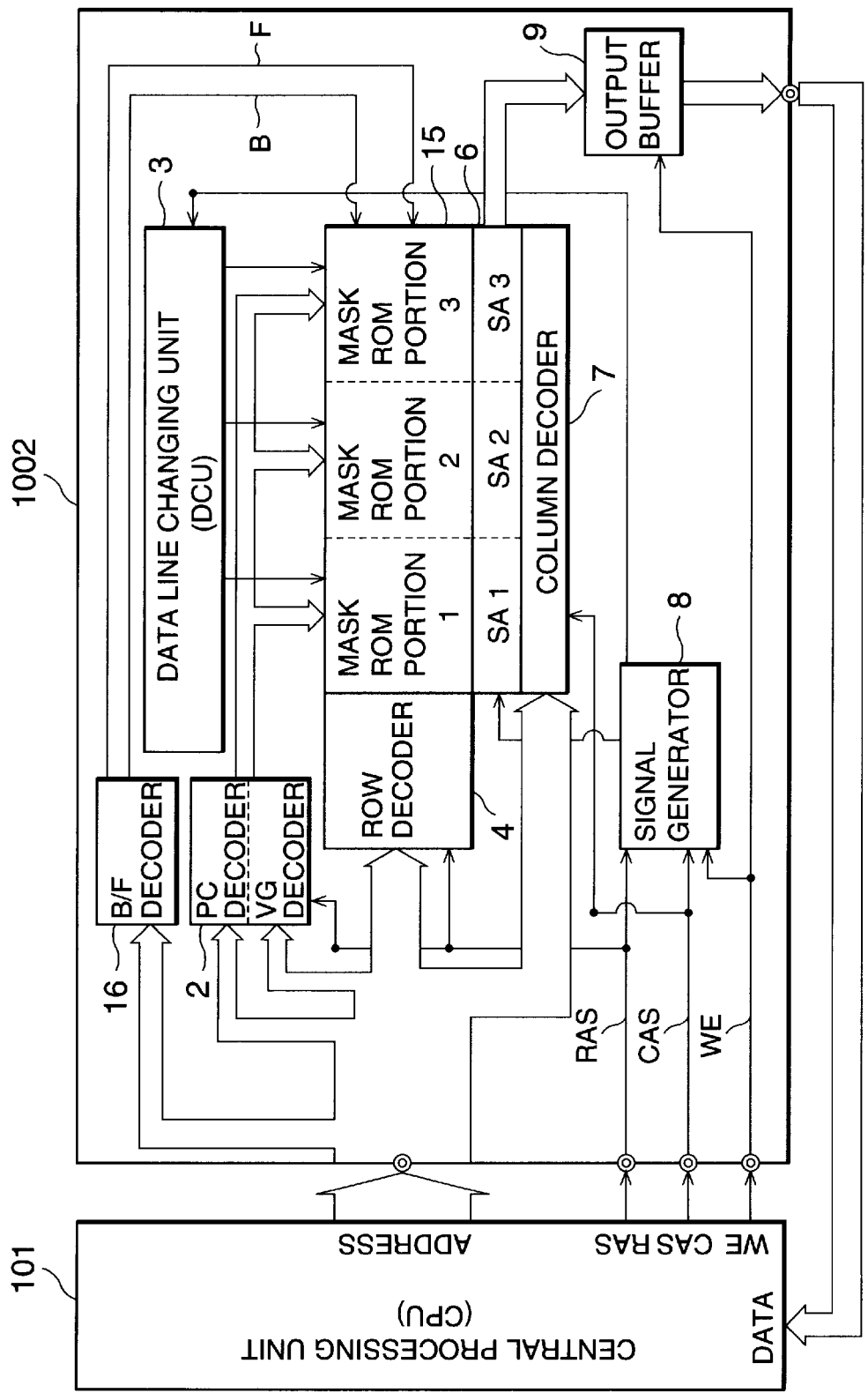
FIG. 9 is a diagram of a single-chip semiconductor MROM system and an external CPU according to a fourth embodiment of the present invention.

Referring now to the drawings, and more particularly to FIG. 9, a single-chip semiconductor ROM system 1002 and an external CPU 101 are described according to a fourth embodiment of the present invention. The same parts in FIG. 9 as those in FIGS. 6–8 are numbered with the same reference numerals as in FIGS. 6–8, and for brevity, an explanation of these parts is omitted.

In the fourth embodiment, the external CPU is located outside of the single-chip semiconductor ROM system 1002. Therefore, the chip size becomes much smaller than the system in FIG. 6. The operation of the fourth embodiment is substantially the same as the third embodiment. Hence, for brevity, an explanation is omitted herein.

In these embodiments, as known by one of ordinary skill in the art taking the present specification as a whole, the type (e.g., N-type, P-type) of the MOS transistors can be changed suitably and easily depending on the design of the ROM system.

Moreover, a ROM system has been described in which the data lines to be connected to the sense amplifier and the data lines to be grounded are alternately arranged. However, the present invention may be applied to a ROM system in which two or more data lines to be grounded are disposed between the data lines to be connected to the sense amplifier.

Further, while the present invention has been described above as a ROM system including a MROM, the invention can be applied suitably to a fused ROM, an EP-ROM, and an EEP-ROM, as well as other memory systems and devices with suitable modifications as would be known by one of ordinary skill in the art at the time.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A read-only memory (ROM) system including a plurality of data lines, a word line, and a voltage source, comprising:

a first ROM cell having a gate connected to said word line and a source-drain path connected between a first data line and a second data line of said plurality of data lines;

a second ROM cell having a gate connected to said word line and a source-drain path connected between said second data line and a third data line of said plurality of data lines;

a third ROM cell having a gate connected to said word line and a source-drain path connected between said third data line and a fourth data line of said plurality of data lines; and a sense amplifier for amplifying data from one of said first, second, and third ROM cells, wherein said first data line is connected to said voltage source and said second data line is connected to said sense amplifier when data from said first ROM cell is read, and said third and fourth data lines are charged to a predetermined voltage.

2. The ROM system as recited in claim 1, further comprising a data line charging unit (DCU) for charging said third and fourth data lines to said predetermined voltage.

3. The ROM system as recited in claim 2, wherein said first, second and third ROM cells comprise mask ROM (MROM) cells.

4. The ROM system as recited in claim 3, further comprising a selector for selecting said third and fourth data lines when said data from said first ROM cell is read, wherein said selector comprises:
a first metal oxide semiconductor (MOS) transistor having a gate for receiving a first signal and a source-drain path connected between said third data line and a first node; and
a second MOS transistor having a gate for receiving said first signal and a source-drain path connected between said first node and said DCU,
wherein said first signal is activated when said data from said first ROM cell is read.

5. The ROM system as recited in claim 4, further comprising:

a fourth ROM cell having a gate connected to said word line and a source-drain path connected between said fourth data line and a fifth data line of said plurality of data lines; and a third MOS transistor having a gate receiving said first signal and a source-drain path connected between said first node and said fifth data line.

6. The ROM system as recited in claim 5, wherein said ROM system is formed on a single semiconductor chip.

7. The ROM system as recited in claim 6, wherein said ROM system is operated by an on-chip central processing unit (CPU).

8. The ROM system as recited in claim 6, wherein said ROM system is operated by an off-chip central processing unit (CPU).

9. The ROM system as recited in claim 3, further comprising a selector for selecting said third and fourth data lines when said data from said first ROM cell is read, wherein said selector comprises:
a first metal oxide semiconductor (MOS) transistor having a gate for receiving a first signal and a source-drain path connected between said third data line and said DCU;

a second MOS transistor having a gate for receiving said first signal and a source-drain path connected between said third data line and a first node; and a third MOS transistor having a gate for receiving a second signal and a source-drain path connected between said first node and said fourth data line, wherein said first signal and said second signal are activated when said data from said first ROM cell is read.

10. The ROM system as recited in claim 9, wherein said ROM system is formed on a single semiconductor chip.

11. The ROM system as recited in claim 10, wherein said ROM system is operated by an on-chip central processing unit (CPU).

12. The ROM system as recited in claim 11, wherein said ROM system is operated by an off-chip central processing unit (CPU).

13. A semiconductor device including a plurality of data lines and a word line, comprising:

a semiconductor substrate;

a first cell formed on said semiconductor substrate, and having a gate connected to said word line and a source-drain path connected between a first data line and a second data line of said plurality of data lines;

a second cell formed on said semiconductor substrate, and having a gate connected to said word line and a source-drain path connected between said second data line and a third data line of said plurality of data lines;

a third cell formed on said semiconductor substrate, and having a gate connected to said word line and a source-drain path connected between said third data line and a fourth data line of said plurality of data lines;

a sense amplifier for amplifying data from one of said first, second, and third cells; and a voltage source, wherein said first data line is connected to said voltage source and said second data line is connected to said sense amplifier when data from said first cell is read, and said third and fourth data lines are charged to a predetermined voltage.

14. The semiconductor device as recited in claim 13, wherein said first, second, and third cells comprise read-only memory (ROM) cells, wherein said device further comprises a data line charging unit (DCU) for charging said third and fourth data lines to said predetermined voltage.

15. The semiconductor device as recited in claim 14, further comprising a selector for selecting said third and fourth data lines when said data from said first ROM cell is read, wherein said selector comprises:

a first transistor having a gate for receiving a first signal and a source-drain path connected between said third data line and a first node; and a second transistor having a gate for receiving said first signal and a source-drain path connected between said first node and said DCU, wherein said first signal is activated when said data from said first ROM cell is read.

* * * * *